US 10,651,683 B2

(12) United States Patent
Savanth et al.

(10) Patent No.: US 10,651,683 B2
(45) Date of Patent: May 12, 2020

(54) HARVESTING POWER FROM AMBIENT ENERGY IN AN ELECTRONIC DEVICE (71) Applicant: ARM Limited, Cambridge (GB)

(72) Inventors: Parameshwarappa Anand Kumar Savanth, Cambridge (GB); James Edward Myers, Bottisham (GB); David Walter Flynn, Cambridge (IN)

(73) Assignee: ARM Limited, Cambridge (GB)

( * ) Notice: Subject to any disclaimer, the term of this patent is extended or adjusted under 35 U.S.C. 154(b) by 247 days.

(21) Appl. No.: 15/313,599

(22) PCT Filed: May 11, 2015

(86) PCT No.: PCT/GB2015/051374
§ 371 (c)(1),
(2) Date: Nov. 23, 2016

(87) PCT Pub. No.: WO2015/193634
PCT Pub. Date: Dec. 23, 2015

(65) Prior Publication Data
US 2017/0201099 A1 Jul. 13, 2017

(30) Foreign Application Priority Data
Jun. 17, 2014 (GB) .................................. 1410754.4

(51) Int. Cl.
G05D 17/00 (2006.01)
H02J 50/00 (2016.01)
(Continued)

(52) U.S. Cl.
CPC .............. *H02J 50/00* (2016.02); *G05B 15/02* (2013.01); *H02J 3/383* (2013.01); *H02J 7/025* (2013.01);
(Continued)

(58) Field of Classification Search
CPC .... H01M 10/465; H01G 11/14; F03D 7/0244; G06F 17/5036; H03F 1/303;
(Continued)

(56) References Cited
U.S. PATENT DOCUMENTS

2004/0113790 A1 6/2004 Hamel et al.
2008/0122449 A1 5/2008 Besser et al.
(Continued)

FOREIGN PATENT DOCUMENTS

CN 102437776 A 5/2012
CN 102712225 A 10/2012
(Continued)

OTHER PUBLICATIONS

PCT/GB2015/051374, International Search Report and Written Opinion, EPO, dated Oct. 19, 2015.
(Continued)

Primary Examiner — Tuan A Vu
(74) Attorney, Agent, or Firm — Leveque IP Law, P.C.

(57) ABSTRACT

An electronic device 50 has at least one harvesting unit 52 for harvesting power from ambient energy. At least one circuit 54, including processing circuitry 56, is supplied with power from the harvesting unit 52. Control circuitry 60 is provided to adjust at least one property of the processing circuitry 56 or the at least one harvesting unit 52 to reduce impedance mismatch between an output impedance of the harvesting unit 52 and an input impedance of the at least one circuit 54.

23 Claims, 6 Drawing Sheets

PV maximum power transfer occurs when output and input impedances match
$Z_{out-pv} \cong Z_{in-eff}$ (51) Int. Cl.
  *H02J 7/02* (2016.01)
  *H02J 50/40* (2016.01)
  *G05B 15/02* (2006.01)
  *H02J 3/38* (2006.01)
  *H02M 3/04* (2006.01)

(52) U.S. Cl.
  CPC ............... *H02J 50/40* (2016.02); *H02M 3/04* (2013.01); *H03F 2200/222* (2013.01); *H03F 2200/387* (2013.01)

(58) Field of Classification Search
  CPC ........ H03F 2200/222; H03F 2200/387; H03M 1/002; G11C 5/147; H03H 7/38; H02M 3/07; H02J 50/00
  See application file for complete search history.

(56) References Cited

U.S. PATENT DOCUMENTS

| | | | |
|---|---|---|---|
| 2009/0058190 A1 | 3/2009 | Tanaka | |
| 2009/0067208 A1 | 3/2009 | Martin et al. | |
| 2009/0133733 A1* | 5/2009 | Retti | H01M 10/465 136/206 |
| 2009/0134952 A1* | 5/2009 | Smith | H03H 7/38 333/32 |
| 2010/0026542 A1* | 2/2010 | Wang | H03F 1/303 341/155 |
| 2010/0060231 A1* | 3/2010 | Trainor | H01G 11/14 320/103 |
| 2010/0295305 A1* | 11/2010 | Mahawili | F03D 7/0244 290/44 |
| 2011/0053500 A1 | 3/2011 | Menegoli et al. | |
| 2011/0069516 A1 | 3/2011 | Greene et al. | |
| 2011/0101789 A1* | 5/2011 | Salter, Jr. | H02M 7/217 307/104 |
| 2011/0221416 A1 | 9/2011 | Ivanov et al. | |
| 2011/0254514 A1* | 10/2011 | Fleming | H02M 3/07 320/166 |
| 2012/0307538 A1 | 12/2012 | Ramorini et al. | |
| 2013/0159746 A1* | 6/2013 | Kobayashi | G11C 5/147 713/320 |
| 2013/0229293 A1* | 9/2013 | Standley | H03M 1/002 341/122 |
| 2014/0070621 A9 | 3/2014 | Von Novak et al. | |
| 2014/0181782 A1* | 6/2014 | Verghese | G06F 17/5036 716/136 |

FOREIGN PATENT DOCUMENTS

| | | |
|---|---|---|
| CN | 102396132 B | 6/2015 |
| WO | WO 2011/060798 | 5/2011 |
| WO | WO 2012/085119 | 6/2012 |

OTHER PUBLICATIONS

T. Paing, J. Shin, R. Zane and Z. Popovic, "Resistor Emulation Approach to Low-Power RF Energy Harvesting," in IEEE Transactions on Power Electronics, vol. 23, No. 3, pp. 1494-1501, May 2008.

* cited by examiner

PV maximum power transfer occurs when output and input impedances match $Z_{out\text{-}pv} \cong Z_{in\text{-}eff}$

HARVESTING POWER FROM AMBIENT ENERGY IN AN ELECTRONIC DEVICE

The present technique relates to the field of electronic devices. More particularly, it relates to devices which harvest power from ambient energy.

There is an increasing demand for electronic devices with a very low power budget, especially as part of the increasing move towards the "Internet of Things" (IoT) in which relatively small devices are connected together, for example for performing tasks such as monitoring temperature or other environmental conditions, controlling heating in a home, or controlling street lighting for example. While mobile and other embedded applications have been designed with a relatively low power budget relative to laptops and desktop computers because their battery is expected to last at least a day on a single charge, the power budget for wireless sensor nodes, and other small embedded devices in the IoT is several orders of magnitude lower. Many sensor applications do not have the option for wired charging of batteries, and also cannot be powered from wall sockets. This extreme energy constraint is unlike many other applications where the design trade off has primarily been between speed and power.

Therefore, there is an increasing demand for sensors which can harvest energy from their environment to reduce battery usage and prolong battery lifetime. The present technique seeks to provide a more energy efficient way of exploiting energy harvested from ambient sources in an electronic device.

Viewed from one aspect, the present technique provides an electronic device comprising:

at least one harvesting unit configured to harvest power from ambient energy;

at least one circuit to be supplied with power from the at least one harvesting unit, the at least one circuit comprising processing circuitry configured to perform data processing; and control circuitry configured to adjust at least one property of the processing circuitry or the at least one harvesting unit to reduce impedance mismatch between an output impedance of the at least one harvesting unit and an input impedance of the at least one circuit.

An electronic device has at least one harvesting unit for harvesting power from ambient energy. Typically, harvesting units have a variable output power since the ambient energy available for harvesting varies and also because the amount of power supplied by the harvesting unit depends on how closely the output impedance of the harvesting unit matches the input impedance of at least one circuit supplied with power by the harvesting unit. In general there exists a point of maximum power extraction which occurs when the harvester output impedance matches the input impedance of the load circuit. Therefore, in order to achieve high power extraction efficiency, and avoid wasting the ambient energy available, it is useful to provide control circuitry for controlling the impedance matching.

However, in known systems this tracking is usually done by adjusting the impedance of a power converter provided for converting the power supplied by the harvesting unit into a steady power for controlling the processing circuit. For example, a DC-DC converter may be used. This is because in known systems it is considered essential that the processing circuitry is provided with a steady voltage which does not vary and so the DC-DC converter is used to guarantee a steady output as the amount of ambient energy varies. Therefore, in known systems the tracking of the maximum power extraction point is usually carried out by adjusting a property of the DC-DC converter.

However, the inventors of the present technique recognised that such a power converter usually requires a certain minimum voltage to operate, and there is a significant amount of time when in practice the energy harvester cannot supply enough voltage to power the converter. Therefore, in existing systems there are periods when the processing circuitry cannot operate because the converter is out of action. Nevertheless, processing circuitry is available which can operate in near- or sub-threshold modes where the processor is supplied with a lower voltage than the minimum voltage required for the power converter. Therefore, it is possible to operate the processing circuitry even when the power supplied from the harvesting unit is insufficient to run a power converter.

Therefore, instead of using a power converter to track power harvesting efficiency, the present technique provides control circuitry which adjusts at least one property of the processing circuitry or the at least one harvesting unit to reduce impedance mismatch between an output impedance of the harvesting unit and an input impedance of the at least one circuit which is supplied with power by the harvesting unit. The control circuitry may adjust a property of the processing circuitry only, or a property of the harvesting unit only, or properties in both the processing circuitry and the harvesting unit. This is counter intuitive since one would normally not consider adjusting the operation of the processing circuitry itself in order to achieve better energy extraction, since most systems are designed to optimize the processing performance or energy efficiency of the processing circuitry, and adjusting the processing circuitry to improve impedance matching may in fact increase the energy consumed by the processing circuitry. However, the inventors realised that even if the adjustment makes the processing circuitry less energy efficient when viewed in isolation, the overall energy efficiency of the device as a whole can be improved by enabling the energy harvesting unit to harvest more energy due to the improved impedance matching. This can help to improve overall battery lifetime.

Hence, by adjusting a property of either the processor or the harvesting unit, the control circuitry can adjust the relative impedances of the processor and the harvesting unit to reduce the mismatch between these impedances. The adjustment need not actually achieve the optimum power extraction point where the impedances exactly match, although this is preferred if possible. It may be sufficient to make the harvester output impedance and circuit input impedance closer together, rather than matching exactly. For example, sometimes attempting to exactly match the impedances may require a complicated operation and it may be more efficient to perform an approximate matching of the impedances, which can still improve the efficiency of power extraction from the harvester.

By performing impedance matching by adjusting a property of the processor or the harvesting unit(s), it is not necessary to provide a DC-DC converter or other power converter. Hence, in at least one mode of operation of the electronic device, the processing circuitry may be powered directly from the power harvested by the at least one harvesting unit, without any intervening power converter. This allows the processing circuitry to operate at lower voltages than the threshold required for powering the power converter.

In some systems there may be no power converter provided at all between the harvesting unit and the processor so that the processing circuitry is coupled directly to an output of the harvester. By eliminating the power converter, the area and power overhead associated with the converter can be avoided.

Alternatively, a power converter may still be provided, which can generate a converted voltage from the power generated by the harvesting unit. In this case, the device may have a power-converted mode of operation in which the processing circuit is powered using the converted voltage from the power converter, and a non-power-converted mode in which the processing circuitry is powered directly from the at least one harvesting unit. For example, to generate a stable voltage it may be preferable to use the power converter when there is sufficient energy to run the power converter, but when there is insufficient energy for this, the processor may carry on operating using the direct energy from the energy harvester. In such a system, the control circuit may optionally also adjust properties of the power converter to reduce the impedance mismatch between the at least one circuit (referred to as "load circuit" below) and the harvester output when in the power-converted mode. During the non-power-converted mode the control circuit may adjust properties of the processor or the energy harvester, but not the power converter.

There may be different ways of adjusting properties of the processing circuitry or the at least one harvesting unit to reduce the impedance mismatch reduction. For example, the control circuitry may detect at least one harvester parameter which indicates either an amount of power generated by the at least one harvesting unit or a property of environmental conditions of the at least one harvesting unit, and the control circuitry may adjust at least one property of the processor or the harvesting unit based on the detected harvester parameter. For example, the harvester parameter may be a voltage or current generated by the harvesting unit, or a temperature or light intensity detected in the environment of the harvesting unit, which may affect the output impedance of the harvester and so can be used to control the impedance matching. The control circuitry may repeat the detection of the harvester parameter and the adjustment of the least one property at periodic intervals or continuously, to provide a closed loop adjustment of the impedance of the harvester or the processor to react to changes in the conditions of the harvester.

There may be different ways of adjusting the property based on the detected harvester parameter. For example, a digital or analogue circuit or lookup table may be used to provide a certain relationship between the harvester parameter and a corresponding property of the processor or the harvesting unit.

In one example, the at least one property adjusted to reduce impedance mismatch may be a property of at least one clock signal supplied to the processing circuitry. For example, the property of the clock signal may be its frequency. Increasing the clock frequency changes the impedance of the processing circuitry (e.g. the impedance of the processor may go down as the clock frequency increases). Therefore, if the impedance of the processor is too high the clock frequency could be increased to reduce its impedance and bring the impedance closer to the output impedance of the harvester to improve power extraction. A clock generator may be included which generates a clock signal with a variable clock frequency, and the control circuitry may control the clock generator to adjust the clock frequency to reduce the impedance mismatch. For example, the control circuitry may have a bias generator which generates a bias control parameter based on the harvester parameter discussed above, and this bias control parameter (e.g. a voltage or current) may control the clock generator to adjust the clock frequency. The bias generator may be an analogue or digital circuit which implements a given relationship (e.g. a polynomial relationship) between the detected harvester parameter and the clock frequency. When a clock generator is provided, then the input impedance of the at least one circuit may depend on both the impedance of the processor and the impedance of the clock generator. Changing the clock frequency may vary the impedance of the clock generator as well as the processor. Therefore, the mapping provided by the bias generator may consider the effects of changing frequency on both the processor and clock generator.

Another way of adjusting a clock signal may be to selectively gate some clock pulses of a clock signal, to change which clock pulses are propagated to the processor. For example, clock gates located on the clock path between the clock generator and the processor may be controlled by the control circuitry to change the number of clock pulses seen by the processor, to reduce the impedance mismatch.

In some examples the processing circuitry may have different portions or different hardware devices which are supplied with different phases of a clock signal, and the adjustment may include selecting which phases are supplied to the processing circuitry or halted. The impedance of the processing circuitry seen by the harvester varies depending on the amount of circuitry which is active, so this can be exploited to improve the matching of the input impedance of the load circuit and the output impedance of the harvester.

Another property of the processor which can be adjusted to reduce impedance mismatch may be a bias signal which biases transistors within the processing circuitry. For example, a bias voltage or current may be applied to well regions of MOS transistors to forward bias transistors by different amounts to tune the performance of the processor and hence the input impedance of the load circuit being powered by the harvester. In some cases the bias signal for the processor may also be applied to transistors in other parts of the circuit, so may also affect the impedance of other parts of the at least one circuit, not just the processor.

Also, the control circuitry may adjust which hardware devices of the processing circuitry are in a power saving state. This may be done by selectively gating clock signals to the devices as discussed above, or by powering up and down the hardware devices (e.g. a memory, cache, sensor or radio unit used by the processor) by using power gates to isolate the power supplied to the hardware devices.

The control circuitry may also control the processor to select which software processes are executed by the processing circuitry. For example, certain software processes may be associated with greater impedance of the overall processing circuitry than other software processes (e.g. some software processes may require more hardware units to be active). For some sensor nodes or other IoT devices, the exact timing at which certain processes are performed may not be particularly important and so the processor may have freedom to choose exactly when certain processes are executed. For example, there may be a time window within which a process should be carried out, and so the control circuitry could wait for a time when the output impedance of the harvester matches (or is closer to) the input impedance of the load circuit when performing that process before scheduling the process on the processor.

It is also possible to adjust a property of the harvesting unit. For example, an operating condition of the harvesting unit which affects impedance may be varied. For example, some harvesting units have two or more different configurations with different impedances and so one of these configurations could be selected depending on the input impedance of the load circuit. For example, several photovoltaic cells can be connected either in parallel or in series to produce different impedances. Also, the control circuitry could adjust external conditions of the harvester, e.g. the operating temperature of a photovoltaic cell could be adjusted by an associated heating element, or a variable magnet can be used to adjust the resonant frequency of a radio frequency harvesting unit, which can affect the impedance of the harvester.

Also, if several harvesting units are provided in the same device, the control circuitry can control which harvesting unit supplies the processor with power, to improve the impedance matching. For example, a device may have a photovoltaic cell as well as a thermal energy harvester, and the control circuitry may select the harvester whose impedance best matches the input impedance of the load circuit at a given moment. Also, several harvesters of the same type may be used which have different operating parameters (e.g. photovoltaic cells targeting different wavelength bands). In other examples, one harvester could be used for powering the processing circuitry while another harvester charges a storage device such as a battery or capacitor, and the adjustment may comprise swapping which harvester powers the processing circuitry and which harvester powers the storage device, to improve the impedance matching. Other systems may time division multiplex use of each harvester, and the control circuitry could adjust the relative length of time when each harvester is used to supply power to the at least one circuit based on impedance matching.

Also, when adjusting a property of the processing circuitry to reduce the impedance mismatch in a system having several energy harvesting units, the control circuitry may perform different amounts of adjustment or different types of adjustment depending on which of the available harvesting units is being used to supply power to the processing circuitry. For example, a different clock frequency change may be applied depending on the particular harvesting unit currently supplying power to the processing circuitry.

Sometimes the energy harvesting unit may generate more power than is required by the processing circuitry or the rest of the at least one circuit, or may be able to harvest energy when the processing circuitry is inactive. An energy storage device such as a battery or a capacitor may be provided for storing energy supplied by the harvesting unit, so that later when the energy harvester cannot generate enough power for the processor, the processor can be supplied with power from the storage device instead. Hence, there may be a first mode of operation in which the processor is powered by the harvesting unit and a second mode of operation in which the processing circuitry is powered by the energy storage device.

The control circuitry may perform the impedance adjustment control only in the first mode of operation and not in the second mode of operation. The adjustment of a property of the processor or the energy harvester when in the first mode of operation may increase the power consumed by the processor (e.g. an increase in clock frequency may increase the power consumed). When in the first mode, this is not a problem since the increase in power consumed by the processor may be less than the increase in power extracted by the harvesting unit achieved by improving the impedance matching. However, when in the second mode then the impedance adjustment risks draining the energy stored in the storage device more quickly, so to save energy the control circuitry can stop tracking the power extraction efficiency. Instead, the processor may instead be adjusted to save energy (e.g. by reducing the clock frequency, reducing the well bias voltage, or reducing the number of active hardware units or software processes).

The energy storage device may be provided with power conversion circuitry for converting a first voltage derived from the energy harvesting unit to a second voltage to be supplied to the storage device to charge it. For example, a battery may need a higher voltage than is generated by the energy harvester. When the power converter is provided, the input impedance of the at least one circuit may depend on the impedance of the power converter as well as the processor. Similarly, when discharging the energy storage device to power the processing circuitry, the power conversion circuitry may convert a third voltage supplied by the energy storage device to a fourth voltage used by the processor. To reduce circuit area and leakage, the same circuit can be used for both conversions. For example, the power converter may be provided with two input/output nodes, and on charging the storage device the first voltage from the harvesting unit is supplied to the first input/output node which causes a second voltage to be supplied from the second input/output node, while on discharging the battery the reverse process is performed with the third voltage supplied from the storage device to the second input/output node and the fourth voltage supplied to the processor from the first input/output node. While most power converters could be operated in reverse in this way, in practice they are not often used in this manner. The inventors realised that this approach allows a power converter to be eliminated from previous devices, which typically provide one power converter for charging the storage device and another power converter for powering the processor from the storage device.

Any type of harvesting unit which can harvest ambient energy may be used. In this application, the term "ambient" energy refers to energy existing in the vicinity or neighbourhood of the electronic device, which is not provided by a wired connection. The ambient energy may include energy which is supplied intentionally to the device (e.g. light or a radio transmission provided by a dedicated transmitter for powering the device), as well as energy which happens to be in the vicinity, such as solar radiation, thermal gradients, or intercepted radio broadcasts. Examples of harvesting units include a photovoltaic (solar) cell for harvesting energy from light, a thermoelectric harvesting unit for harvesting energy from temperature variation or gradients, a piezoelectric energy harvester for harvesting energy from mechanical or acoustical vibrations, or a radio energy harvester for harvesting energy from radio frequency radiation.

Viewed from another aspect, the present technique provides an electronic device comprising:

at least one harvesting means for harvesting power from ambient energy;

at least one circuit means for being supplied with power from the at least one harvesting unit, the at least one circuit means comprising processing means for performing data processing; and control circuitry means for adjusting at least one property of the processing means or the at least one harvesting means to reduce impedance mismatch between an output impedance of the at least one harvesting means and an input impedance of the at least one circuit means.

Viewed from another aspect the present technique provides a method of operating an electronic device comprising steps of:

harvesting power from ambient energy using at least one harvesting unit;

supplying at least one circuit with power from the at least one harvesting unit, the at least one circuit comprising processing circuitry configured to perform data processing; and adjusting at least one property of the processing circuitry or the at least one harvesting unit to reduce impedance mismatch between an output impedance of the at least one harvesting unit and an input impedance of the at least one circuit.

Viewed from another aspect, the present technique provides a computer-implemented method of designing an integrated circuit layout for an electronic device, the method comprising using an automated design tool to generate data defining the integrated circuit layout, the integrated circuit layout comprising:

an input node for receiving power harvested from ambient energy by at least one harvesting unit;

at least one circuit to be supplied with power from the input node, the at least one circuit comprising processing circuitry configured to perform data processing; and control circuitry configured to adjust at least one property of the processing circuitry or the at least one harvesting unit to reduce impedance mismatch between an output impedance of the at least one harvesting unit and an input impedance of the at least one circuit.

Automated design tools may be used to design an electronic device according to the present technique. For example, electronic design automation (EDA) tools may use a cell library defining a set of standard cells available for selection for inclusion in an integrated circuit layout. Cells may be included corresponding to the at least one circuit, processing circuitry and control circuitry described above. The at least one harvesting unit need not be included in the integrated circuit layout, and instead an input node may be provided for receiving power from a harvesting unit which is integrated into an electronic device comprising the integrated circuit at a later stage of manufacture. The generated data defining the integrated circuit layout can then be used to control fabrication of the integrated circuit having the designed layout.

Further features advantages and aspects of the invention will be apparent from the following description of examples which is to be read in conjunction with the accompanying drawings in which:

FIG. 8 shows an example of an electronic device with a bias generator for generating a bias parameter for controlling a clock frequency of an oscillator;

Figure 1:
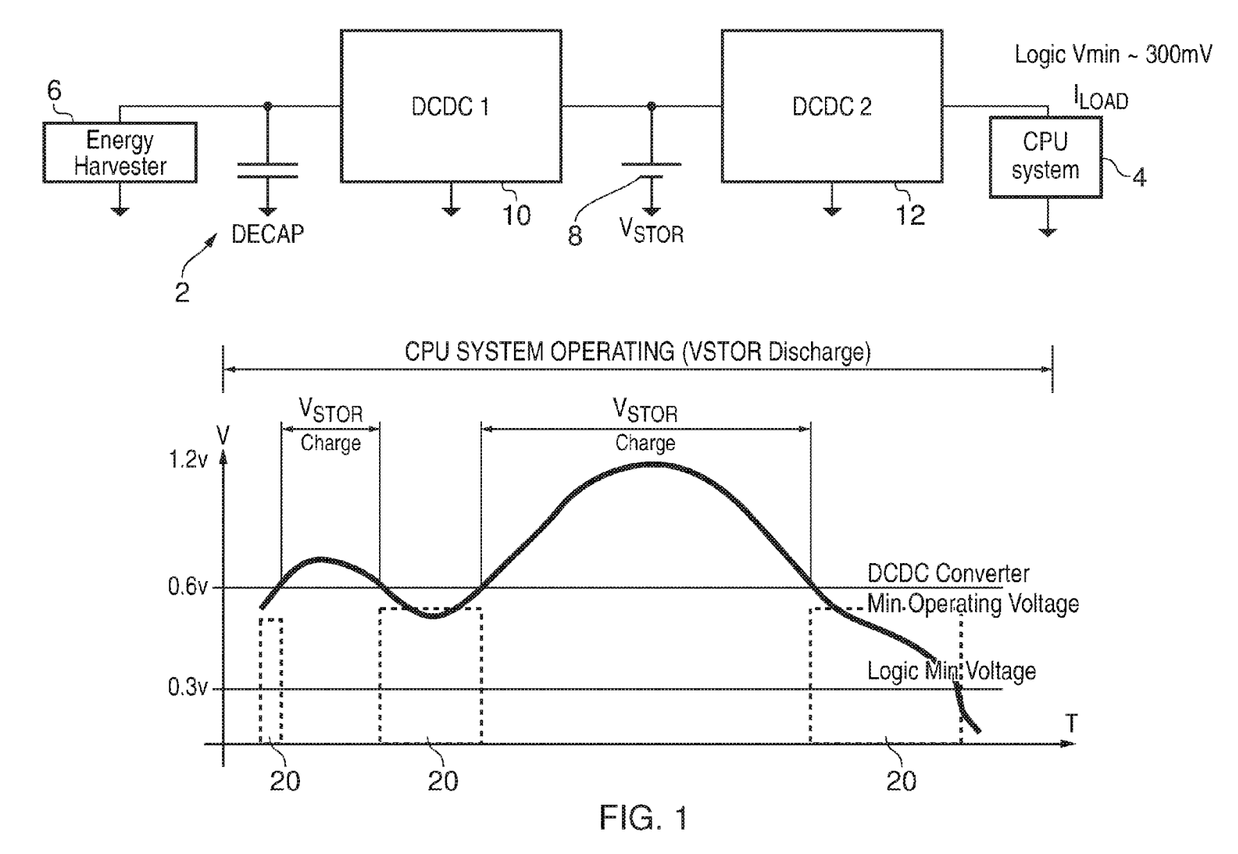
FIG. 1 illustrates a problem with a known electronic device using an energy harvester.

FIG. 1 shows a known electronic device 2 having a CPU system 4 for performing processing operations, and an energy harvester 6 for harvesting energy from ambient sources. For example the energy harvester may be a solar cell. A storage element (e.g. capacitor or battery) 8 is provided for storing energy harvested by the harvester 6. A DC-DC converter 10 converts a voltage generated by the harvester 6 to a higher voltage for charging the storage element 8. A further DC-DC converter 12 is provided for converting a voltage output by the storage element 8 to a voltage to be supplied to the CPU system 4. The converters 10, 12 require a certain voltage to be able to operate. For example, DC-DC converters may require a minimum operating voltage of around 0.6 V. However, as shown in the graph at the bottom of FIG. 1, the energy harvester 6 may output a varying voltage as environmental conditions change and there may be time periods 20 when the output voltage drops below 0.6 V. As the DC-DC converter 10 cannot function during these periods 20, the CPU system 4 would have to depend on stored energy and so energy which could have been harvested by the harvester 6 is wasted. The minimum operating voltage for CPUs can be lower than the minimum operating voltage of the DC-DC converters. For example, some systems can operate at near-threshold or sub-threshold voltages, e.g. around 0.3 V. Therefore, there is scope for improving the utilisation of the energy harvested by the harvesting unit 6.

Figure 2:
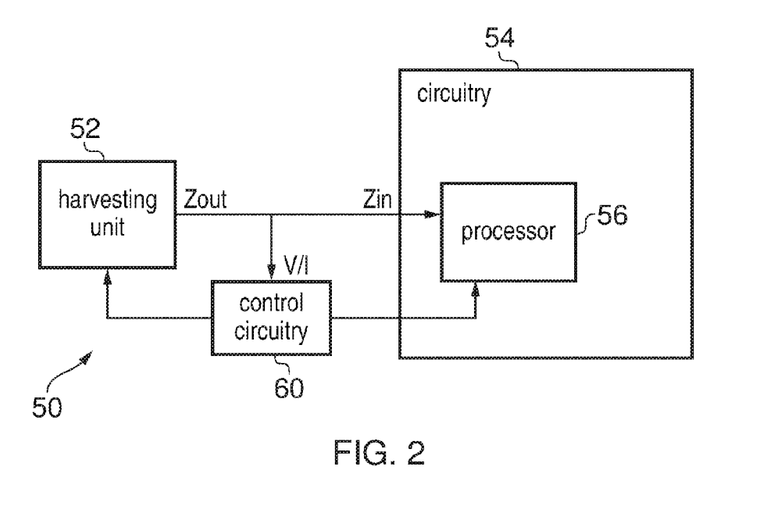
FIG. 2 shows a first example of an electronic device having control circuitry for adjusting a property of a processor or a harvesting unit to reduce impedance mismatch.

FIG. 2 shows an example of an electronic device 50 according to the present technique. The device 50 has a harvesting unit 52 for harvesting power from ambient energy. The harvesting unit 52 may be a photovoltaic cell for harvesting energy from ambient light. Also, the harvesting unit 52 may be a thermoelectric device which generates energy from temperature gradients or variations. For example, if the device 50 is a wearable device (e.g. embedded in a watch, a pair of glasses or item of clothing), one part of the device which is next to the skin of the person wearing the device may be warmer than another part of the device which is exposed to the outside air, and so the temperature gradient between these extremes may be exploited for energy harvesting using the thermoelectric effect. Other examples of energy harvesters include piezoelectric devices for harvesting energy from ambient vibrations, including mechanical or sound noise, or harvesters for harvesting energy from radio frequency or other wavelengths of electromagnetic radiation. The device 50 also has circuitry 54 which is directly powered using the harvesting unit 52. Unlike in FIG. 1, no power converter is provided between the harvesting unit 52 and the circuitry 54. The circuitry of 54 may include any circuit powered by the harvester, and includes at least a processor 56 for performing data processing. Other elements of the circuitry 54 may for example include a memory unit, bus, radio transmitter/receiver unit, sensor etc.

The power which can be harvested from the harvesting unit 52 depends not only on ambient conditions (e.g. the amount of light, temperature gradient or noise), but also on the extent to which an output impedance Zout of the harvesting unit 52 matches an input impedance Zin of the circuitry 54. Therefore, control circuitry 60 is provided to track the maximum power extraction and to adjust at least one property of the harvesting unit 52 or the processor 56 (or both) to reduce the mismatch between the output impedance Zout of the harvester 52 and the input impedance Zin of the circuitry 54. For example, as shown in FIG. 2 the control circuitry may detect a voltage or current generated by the harvesting unit 52 and may use this to set a property of the processor 56 or the harvesting unit 5, such as a clock frequency or well bias voltage. By adjusting properties of the harvester 54 or the processor 56 to improve impedance matching, the DC-DC converter can be minimized while still maintaining a system at the preferred operating point with maximum (or close to maximum) power extraction. The processor 56, which is now powered directly from the harvester 52, can continue to operate when the power (voltage or current) output by the harvester 52 drops too low for powering the DC-DC converter 10.

Figure 3:
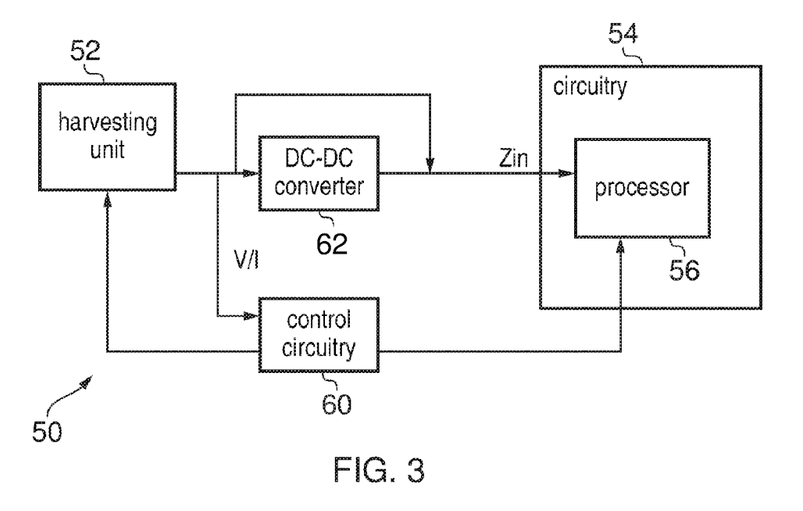
FIG. 3 shows another example in which the device has a DC-DC converter.

As shown in FIG. 3, the electronic device 50 may also include a power converter 62, such as a DC-DC converter for converting a current or voltage generated by the harvesting unit 52 into a voltage for powering the processor 56. The other elements of the system are the same as in FIG. 2. Unlike in FIG. 1, the device 50 of FIG. 3 can operate in either a non-power-converted mode in which the processor 56 and other circuitry 54 is powered using a voltage derived directly from the power harvested by the harvesting unit 52, or a power-converted mode in which a converted voltage provided by the DC-DC converter 62 is supplied to the circuitry 54. Hence, when the harvesting unit 52 generates sufficient power to run the converter 62, the converter can generate a stable voltage for use by the processor 56. When the generated power drops below the threshold for running the converter 62, the system may switch to power the processor directly from the harvester 52. The control circuitry 60 in FIG. 3 may control properties of the processor 56 or harvesting unit 52 to reduce impedance mismatch in the same way as FIG. 2. Again, the arrangement shown in FIG. 3 allows the processing 56 to operate at lower voltages so as to extract useful work from more of the power harvested by the harvesting unit 52.

Figure 4:
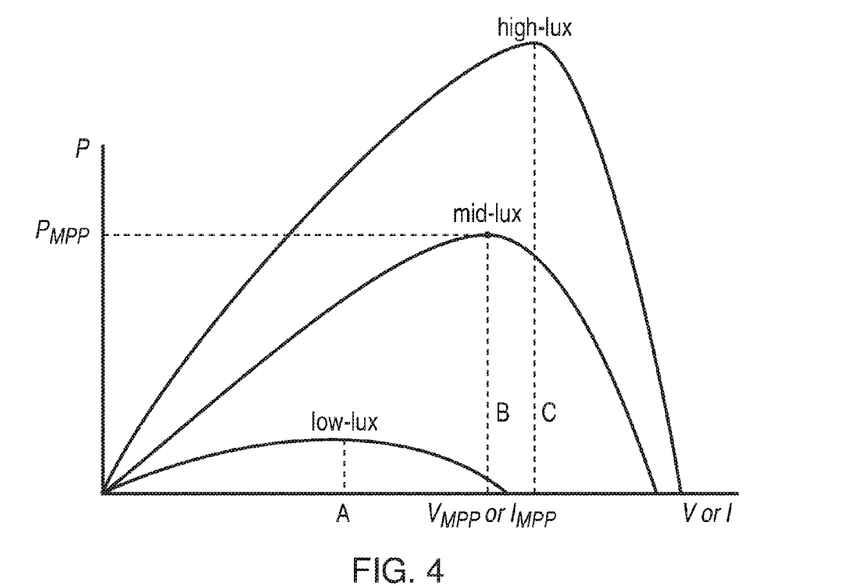
FIG. 4 is a graph showing variation in power output by a harvesting unit at different voltages or currents and at different light intensities.

FIG. 4 is graph showing an example of variation of the power extracted by the harvesting unit 52 with voltage or current drawn by the circuitry 54. For a given amount of ambient energy (e.g. a given amount of light intensity in this example), the power gradually increases as the amount of current drawn by the circuitry 54 increases up to a maximum operating point (MPP) and then starts to decrease as the load current continues to increase. The maximum power extraction occurs when the load and harvester impedances match. As seen from FIG. 4, the maximum operating point varies for different levels of ambient energy such as light intensity (e.g. see the maximum energy extraction at different voltages or currents A, B and C for successively higher amounts of light intensity.

Therefore, to allow for increased energy extraction, the control circuitry 60 can repeatedly or continuously monitor the operation of the harvesting unit 52 and adjust operating conditions of the processor 56 or the harvesting unit 52 to improve impedance matching. For example, the control circuitry could have a sensor which senses light intensity, temperature gradient, or another environmental condition of the harvester, and the control circuit 60 may adjust a property of the processor 56 or the harvester 52 depending on the detected condition. Also, the control circuitry 60 may detect a voltage or current generated by the harvester and use this to adjust a property of the processing circuitry 56 or harvester 52. For example, the control circuitry 60 may have a lookup table, or an analogue or digital circuit providing a mapping from a detected parameter of the harvester to a corresponding property of the harvester 52 or processing circuitry 56. Alternatively, rather than having a predefined relationship between a detected parameter of the harvester and a properties of the processor 56 and/or the harvester 52, the control circuitry 60 could use another method such as a hill climbing method where the control circuitry 60 adjusts the properties in a particular direction and then determines whether the harvested power has increased or decreased, and then continues making adjustments until the power is maximised.

It is not essential for the control circuitry 60 to seek to operate the device 50 exactly at the maximum power point. In some cases, the control circuitry 60 may aim to reduce the mismatch in impedance between Zout and Zin, rather than eliminate the mismatch. This can still be useful to push the operating point closer to the peak power extraction to improve energy efficiency.

The control circuitry may adjust various properties of the system to improve impedance matching. For example the control circuit may adjust the conditions of the harvester 52 for example by changing the operating point of harvester by tuning a resonant frequency of an electromagnetic radiation harvester using a magnet, heating a solar cell or by selecting between different configurations such as series or parallel arrangements of solar cells. When changing a property of the processor, the property may include changing which portions of the processor are active or inactive or changing which software algorithms are run by the processor, which can affect the impedance of the circuitry 54 as a whole. For example there may be some inessential software processes which could be shut down or started to vary the impedance Zin. The control circuitry 60 could also adjust well or substrate bias voltages or currents to transistors within the circuitry 54.

Figure 5:
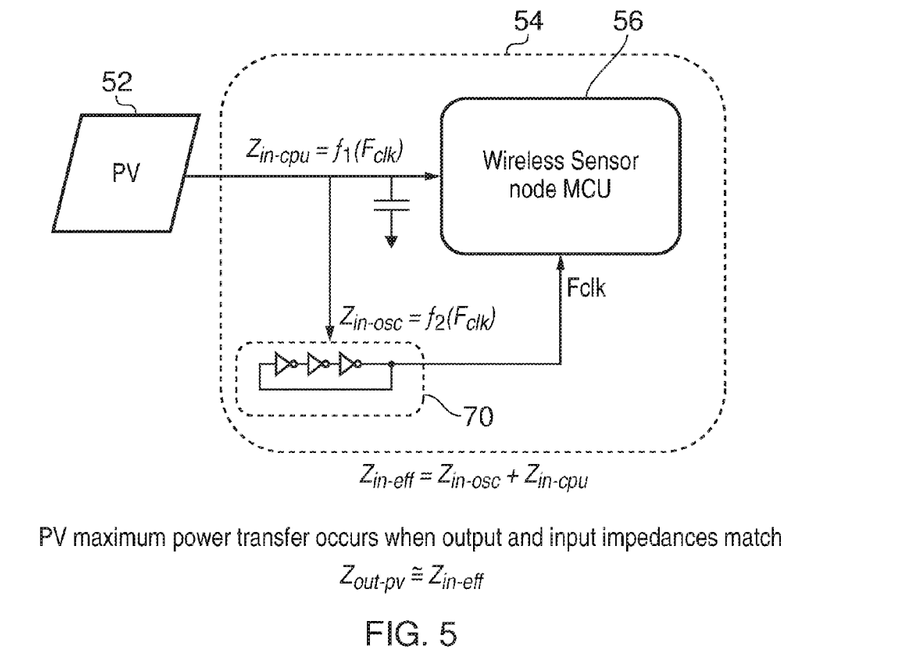
FIG. 5 shows an example in which a clock frequency of a clock supplied to a processor is adjusted to reduce impedance.

FIG. 5 shows an example in which the clock frequency of a clock signal provided to the processor 56 is adjusted. The circuitry 54 includes a clock generator 70 which generates a clock signal for the processor 56. The overall impedance $Z_{in\text{-}eff}$ of the circuitry 54 depends both on the input impedance $Z_{in\text{-}cpu}$ of the processor 56 and on the input impedance $Z_{in\text{-}osc}$ of the clock generator 70. Both the impedances $Z_{in\text{-}cpu}$ and $Z_{in\text{-}osc}$ depend on the clock frequency and so by adjusting the clock frequency the effective impedance $Z_{in\text{-}eff}$ of the circuitry 54 can be adjusted to reduce the mismatch with the output impedance of the harvester 52. For example, the clock generator 70 may be an oscillator and the control circuitry 60 may vary the frequency of the clock signal generated by the oscillator (e.g. a voltage controlled oscillator may be used). Hence, by dynamically adjusting the clock frequency for the processor to reduce impedance mismatch, increased power extraction can be achieved.

Rather than adjusting the frequency of the generated clock, in other examples the control circuitry 60 may control clock gates provided between the clock generator 70 and the processor 56 to reduce the number of pulses provided to the processor 56. Also, the control circuitry 60 may halt the clock signal provided to some parts of the processor 56 while continuing to generate the clock signal for other parts, or provide different parts of the processor 56 with different clock frequencies, to vary the impedance of the processor 56.

Figure 6:
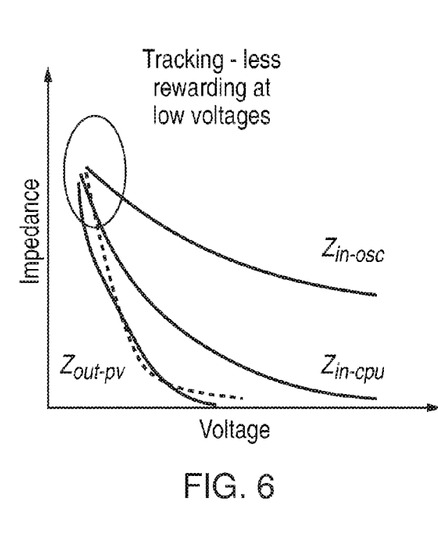
FIG. 6 is graph showing variation of impedance with voltage.

FIG. 6 is a graph showing the variation of impedance with the voltage generated by the harvester 52. The graph shows the oscillator impedance $Z_{in\text{-}osc}$ and the processor impedance $Z_{in\text{-}cpu}$ as well as the output impedance $Z_{out\text{-}pv}$ of the harvesting unit 52. The dotted line in FIG. 6 represents the effective impedance $Z_{in\text{-}eff}$ of the oscillator 70 and processor 56 in combination. As the voltage generated by the harvesting unit 52 decreases the oscillator and CPU impedances get closer to the output impedance of the harvester and so tracking the maximum power point becomes less rewarding at very low voltages. Therefore, in some embodiments the device 50 may have a comparator which compares the voltage output by the harvester 52 with a threshold and if the voltage drops below that threshold then the control circuitry 60 may stop tracking the impedance matching and adjusting the properties of the processor or harvesting unit.

Figure 7:
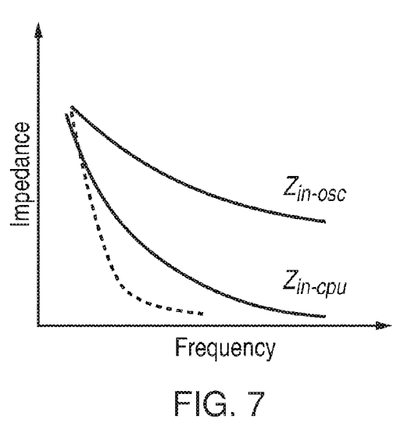
FIG. 7 is a graph showing variation of impedance with frequency of the clock signal.

FIG. 7 shows variation of impedance with clock frequency. Again, the dotted line shows the effective impedance of the load circuit 54 as a whole including the oscillator 70 and processor 56. As shown in FIG. 7 the dotted line crosses the line representing the impedance of the harvesting unit 52 at a given point and so by increasing/decreasing the frequency, the effective impedance of the load circuit 54 can be tuned to match (or reduce mismatch with) the harvester output impedance, to improve power extraction efficiency.

FIG. 8 shows an example of the device 50 in which a bias generator 100 is provided for setting the frequency of the clock oscillator 70 in response to a parameter of the harvester 52. For example, the voltage or current generated by the harvester 52 may be supplied to the bias generator 100 which generates a bias voltage which controls the oscillator 70 to generate the clock signal with a given frequency. For example, the bias generator may include analogue or digital circuitry which maps detected voltages or currents to corresponding operating frequencies. This mapping data may be determined in advance based on the particular type of harvesting unit 52 and load circuit 54 being used. Alternatively, the bias generator 100 could simply adjust the clock frequency in one direction or other and see whether the power generated by the harvester increases or decreases. The example of FIG. 8 also includes a DC-DC converter 120 and energy storage device 110, which are not essential for this embodiment, and will be described in more detail with respect to FIGS. 10 and 11.

Figures 8A, 9:
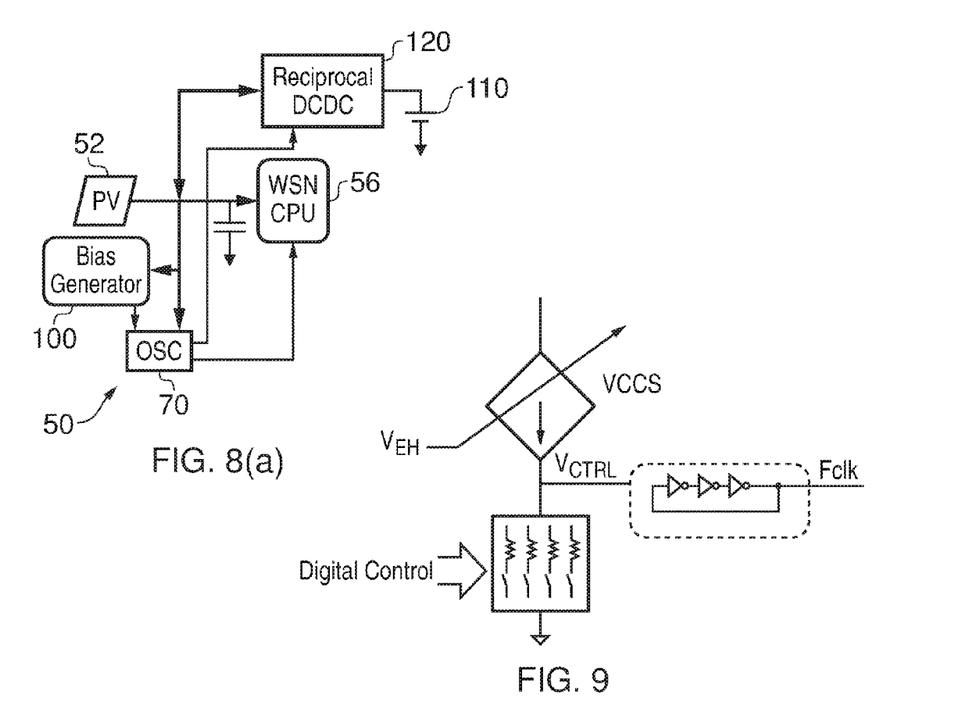
FIG. 9 shows an example circuit for the bias generator.

FIG. 9 shows a conceptual oscillator controlled using a bias generator. The bias control parameter may be a voltage drop ($V_{CTRL}$) across resistors which could be controlled by a digital input to fix an absolute frequency of the output clock ($F_{clk}$). The output from the energy harvesters ($V_{EH}$) is used as the control parameter for a Voltage Controlled Current Source (VCCS) which then controls the variation around the absolute frequency depending on input voltage ($V_{EH}$) thus enabling control of frequency with input voltage.

Figure 10:
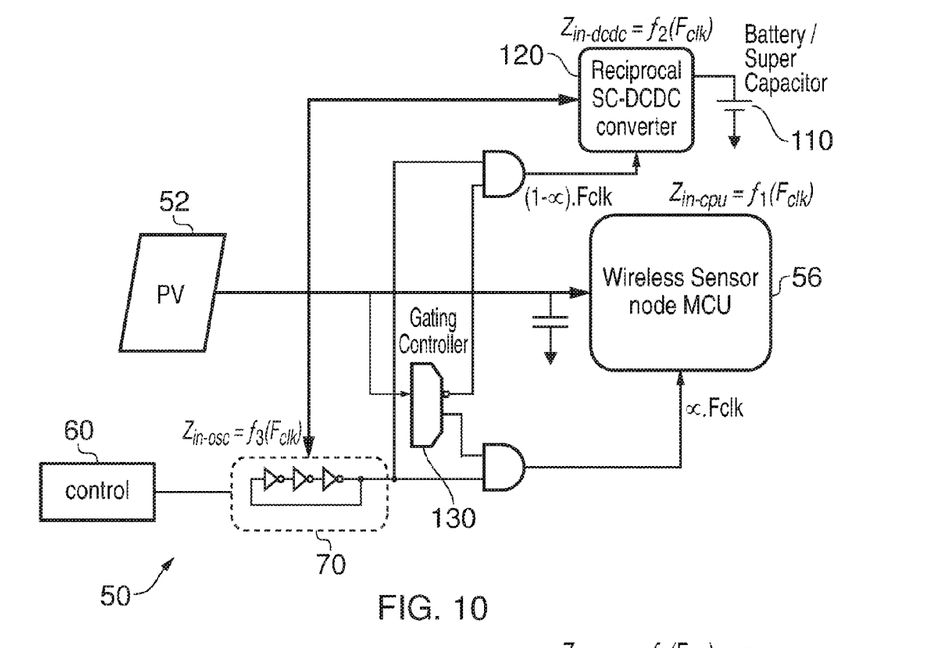
FIG. 10 shows an example of an electronic device having a storage device for storing energy harvested by the harvesting unit.

FIG. 10 shows another example of the electronic device 50 which has an energy storage device 110 for storing energy based on the power supplied by the harvesting unit 52. For example, when the processor 56 is inactive or when the processor is active but there is excess energy available from the harvester 52 that is not required by the processor 56, then the excess energy can be used to charge the storage device 110. The storage device 110 may for example be a battery or a supercapacitor. An additional power converter (e.g. DC-DC converter) 120 is provided between the harvester 52 and the storage device 110 to convert the generated power to a voltage suitable for the storage device 110. For example, the storage device 110 may operate at a higher voltage than the rest of the circuit. The converter 120 may be a reciprocal circuit so that the same converter can be used both for converting from the voltage from the harvester 52 to the voltage used by the storage device 110, and from the voltage generated by the storage device 110 to a voltage used by the CPU 56 when the converter is used in reverse. For example, the CPU may use a lower voltage than is provided by a battery, to save energy. By providing a reciprocal circuit which can convert voltages both when charging and when discharging the storage device 110, this avoids the need to provide two separate power converters 10, 12 as in the example of FIG. 1. In FIG. 10, the clock signal generated by the oscillator 70 is gated by a gating controller 130 which selects which pulses of the clock signal are sent to the converter 120 or to the processor 56. Hence, the gating controller 130 can be used to select whether or not the storage device 110 is charged or whether power is drawn from the storage device 110 by the processor 56. In FIG. 10, the effective impedance of the load circuitry 54 is now dependent on the impedances of the power converter 120, processor 56 and oscillator 70 in combination. These impedances all depend on the clock frequency $F_{clk}$ generated by the oscillator 70, and so the control circuitry 60 can control the effective impedance in a similar way to the earlier examples, but there may be a different relationship between frequency and impedance due to the additional power converter 120, which may be reflected in the bias generator 100 or other control circuitry 60 provided for adjusting the clock frequency.

Figure 11:
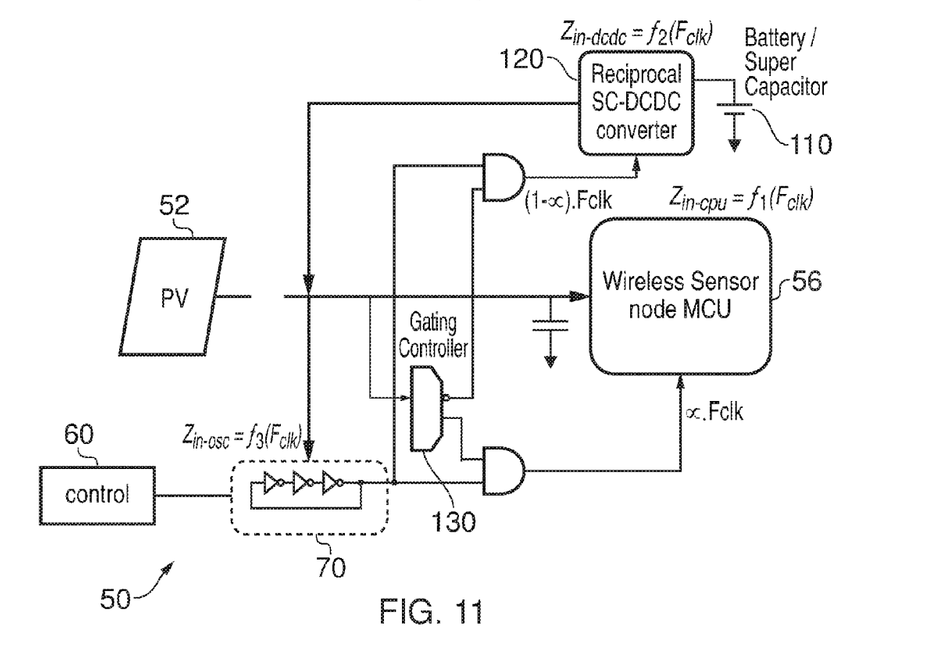
FIG. 11 shows an example of powering a processor using the stored energy.

FIG. 10 shows the device 50 operating in a mode in which the energy from the harvester 52 is supplied to the processor 56 and any excess energy is used to charge the storage device 110. As shown in FIG. 11, if there is not enough energy available from the energy harvester 52, then in another mode of operation the processor 56 can be supplied with power from the storage device 110 via the converter 120. In this case the harvester 52 may optionally be isolated from the rest of the circuit, which can be useful because some harvesters may draw energy from the storage device 110 if the harvester is not decoupled from the rest of the system. By decoupling the harvester 52 when the processor is powered by the storage device 110, the charge on the storage device can be conserved. During the storage energy mode shown in FIG. 11, the control circuitry 60 may stop tracking the maximum operating point of the harvester 52. Instead, the clock frequency of the oscillator 70 can be tuned to reduce the energy consumed by the processor 56, rather than for maximum power extraction (e.g. by reducing the clock frequency). This helps to conserve energy in the storage device 110.

In systems having a storage device 110 as shown in FIGS. 10 and 11, the present technique is very useful. By allowing the processor 56 to operate using energy supplied by the harvester 52 during the periods 20 when the voltage from the harvester 52 is too low to run a power converter, this avoids the need to drain the charge in the storage device 110 during these periods 20, so that stored energy lifetime is increased.

Figure 12:
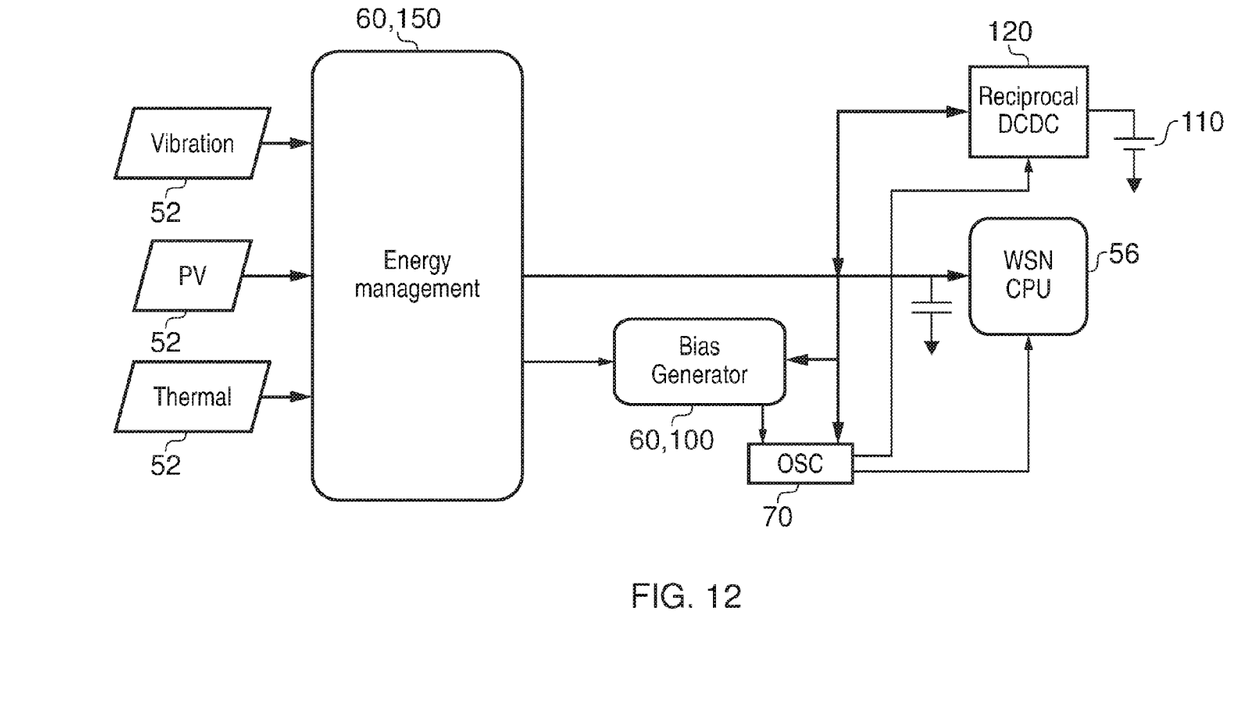
FIG. 12 shows an example of a device having several harvesting units.

As shown in FIG. 12, the device 50 may include multiple energy harvesting units 52, for example harvesters of different types or characteristics. In this example, the harvesters 52 include a photovoltaic cell, a thermoelectric harvester and a vibration harvester (which could harvest energy from acoustic or mechanical vibrations). It is also possible to provide harvesting units of the same type with different operating characteristics, such as photovoltaic cells optimised for different wavelengths. An energy management unit 150 controls which of the harvesting units 52 is used to power the rest of the circuitry. For example, the energy management unit 150 may determine which of the harvesters 52 has the most available energy or the harvester 52 whose extraction is the most efficient for a given circumstance. For example, the energy management unit 150 may determine which harvester 52 has an output impedance Zout which most closely matches the impedance of the load circuitry 54 for a given task. The energy management unit 150 may therefore form part of the control circuitry 60 shown in previous embodiments so that the property which is adjusted to reduce mismatch with the impedance of the load circuitry 54 is the selection of which harvester to use. In other systems, different harvesters may be used for different purposes, e.g. one harvester powering the processor 56 while another harvester charges the storage device 110. In some cases the bias generator 100 may feedback some information to the energy management unit 150 about the effective impedance of the load circuit 54 to allow the energy management unit 150 to control which source 52 to use to achieve the best energy extraction.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

The invention claimed is:

1. An electronic device, comprising:
at least one harvesting unit including a power generation circuit configured to convert ambient energy into an electrical signal having a voltage, the harvesting unit having an output impedance;
a load circuitry, coupled to the harvesting unit via the electrical signal having an input impedance, the load circuitry including:
a clock generator configured to generate a clock signal, and
a processor, coupled to the clock generator via the clock signal, configured to perform data processing; and
a control circuitry, coupled to the harvesting unit via the electrical signal and to the load circuitry via a control signal, configured to adjust at least one property of the processing load circuitry or the harvesting unit to reduce impedance mismatch between the output impedance of the at least one harvesting unit and the input impedance of the load circuitry, including a control signal to:
adjust a property of the clock signal based, at least in part, on the voltage generated by the harvesting unit or a harvester parameter indicative of environmental conditions of the harvesting unit, to change the input impedance of the load circuitry and reduce the impedance mismatch.

2. The electronic device according to claim 1, wherein the control circuitry is configured to detect the harvester parameter indicative of the environmental conditions of the harvesting unit.

3. The electronic device according to claim 1, wherein:
the property of the clock signal is a clock frequency; and
the control circuitry is configured to control the clock generator to adjust the clock frequency to reduce the impedance mismatch.

4. The electronic device according to claim 3, wherein:
the control circuitry comprises a bias generator, coupled to the clock generator, configured to generate a bias control parameter in dependence on the voltage generated by the harvesting unit or the harvester parameter indicative of the environmental conditions of the harvesting unit; and
the clock generator is configured to generate the clock signal with a variable clock frequency which varies in dependence on the bias control parameter generated by the bias generator.

5. The electronic device according to claim 3, where:
when the input impedance of the load circuitry is greater than the output impedance of the harvesting unit, the control circuitry is configured to control the clock generator to increase the clock frequency to reduce the input impedance of the load circuitry to reduce the impedance mismatch; and
when the input impedance of the load circuitry is less than the output impedance of the harvesting unit, the control circuitry is configured to control the clock generator to decrease the clock frequency to increase the input impedance of the load circuitry to reduce the impedance mismatch.

6. The electronic device according to claim 1, wherein said at least one property comprises a bias signal for biasing transistors within the load circuitry.

7. The electronic device according to claim 1, wherein said adjust at least one property comprises adjusting which hardware devices of the load circuitry are in a power saving state.

8. The electronic device according to claim 1, wherein said adjust at least one property comprises adjusting which software processes are executed by the load circuitry.

9. The electronic device according to claim 1, wherein said at least one property comprises an operating condition of the at least one harvesting unit.

10. The electronic device according to claim 1, wherein said at least one harvesting unit includes a plurality of harvesting units.

11. The electronic device according to claim 10, wherein said adjust at least one property comprises adjusting which of the plurality of harvesting units is used to supply power to the load circuitry.

12. The electronic device according to claim 10, wherein said adjust at least one property depends on which of the plurality of harvesting units is used to supply power to the load circuitry.

13. The electronic device according to claim 1, further comprising an energy storage device, coupled to the harvesting unit and the load circuitry, configured to store energy based on the voltage supplied by the at least one harvesting unit.

14. The electronic device according to claim 13, further comprising power conversion circuitry, coupled to the harvesting unit, the load circuitry and the energy storage device, configured to convert a first voltage derived from the voltage generated by the at least one harvesting unit to a second voltage to be supplied to the energy storage device, and to convert a third voltage supplied by the energy storage device to a fourth voltage to be supplied to the load circuitry to power the load circuitry using stored energy.

15. The electronic device according to claim 14, wherein the power conversion circuitry comprises a first input/output node and a second input/output node and is configured to generate the second voltage at the second input/output node in response to the first voltage being supplied to the first input/output node, and to generate the fourth voltage at the first input/output node in response to the third voltage being supplied to the second input/output node.

16. The electronic device according to claim 13, wherein in a first mode of operation the load circuitry is powered by the at least one harvesting unit, and in a second mode of operation the load circuitry is powered by the energy storage device.

17. The electronic device according to claim 16, wherein the control circuitry is configured to adjust said property to reduce said impedance mismatch in the first mode of operation but not in the second mode of operation.

18. The electronic device according to claim 1, wherein the power generation circuit includes:
   a photovoltaic cell for harvesting energy from light;
   a thermoelectric energy converter for harvesting energy from temperature variation or temperature gradients;
   a piezoelectric circuit for harvesting energy from mechanical or acoustical vibration; or
   a radio energy receiver for harvesting energy from radio frequency radiation.

19. A non-transitory computer readable storage device storing data defining an integrated circuit layout of an electronic device according to claim 1.

20. The electronic device according to claim 1, wherein, in at least one mode of operation of the electronic device, the load circuitry is powered directly from the harvesting unit without an intervening power converter.

21. The electronic device according to claim 20, wherein the load circuitry is coupled directly to an output of the harvesting unit without the intervening power converter.

22. The electronic device according to claim 20, further comprising:
   said power converter configured to generate a converted voltage from the voltage generated by the harvesting unit,
   wherein, in a power-converted mode of operation, the load circuitry is powered using the converted voltage generated by the power converter, and in a non-power-converted mode of operation, the load circuitry is powered directly by the harvesting unit without the intervening power converter.

23. A method of operating an electronic device, comprising:
   generating an electrical signal by at least one harvesting unit the electrical signal having a voltage, the harvesting unit including a power generation circuit configured to convert ambient energy into the electrical signal, the harvesting unit having an output impedance;
   supplying the electrical signal to a load circuitry having an input impedance, the load circuitry including a clock generator configured to generate a clock signal and a processor, coupled to the clock generator via the clock signal, and configured to perform data processing; and,
   adjusting, by a control circuitry coupled to the harvesting unit via the electrical signal and to the load circuitry via a control signal at least one property of the load circuitry or the harvesting unit to reduce impedance mismatch between the output impedance of the harvesting unit and the input impedance of the load circuitry, including:
   adjusting, by the control circuitry, a property of the clock signal based, at least in part, on the voltage generated by the harvesting unit or a harvester parameter indicative of environmental conditions of the harvesting unit, to change the input impedance of the load circuitry and reduce the impedance mismatch.

* * * * *

UNITED STATES PATENT AND TRADEMARK OFFICE
CERTIFICATE OF CORRECTION

PATENT NO. : 10,651,683 B2  
APPLICATION NO. : 15/313599  
DATED : May 12, 2020  
INVENTOR(S) : Parameshwarappa Anand Kumar Savanth, James Edward Myers and David Walter Flynn Page 1 of 1

It is certified that error appears in the above-identified patent and that said Letters Patent is hereby corrected as shown below:

On the Title Page

(72) Inventors should read:  
Parameshwarappa Anand Kumar Savanth, Cambridge (GB);  
James Edward Myers, Bottisham (GB);  
David Walter Flynn, Cambridge (GB)

Signed and Sealed this  
Twenty-fifth Day of August, 2020

Andrei Iancu  
*Director of the United States Patent and Trademark Office*